(12) United States Patent
Bhatkar et al.

(10) Patent No.: US 10,121,755 B1
(45) Date of Patent: Nov. 6, 2018

(54) ROBUST CHAMFER DESIGN FOR SEAL RING

(71) Applicant: GLOBALFOUNDRIES Singapore Pte. Ltd., Singapore (SG)

(72) Inventors: Mahesh Bhatkar, Singapore (SG); Juan Boon Tan, Singapore (SG); Wanbing Yi, Singapore (SG)

(73) Assignee: GLOBALFOUNDRIES SINGAPORE PTE. LTD., Singapore (SG)

( * ) Notice: Subject to any disclaimer, the term of this patent is extended or adjusted under 35 U.S.C. 154(b) by 0 days.

(21) Appl. No.: 15/713,687

(22) Filed: Sep. 24, 2017

(51) Int. Cl.
*H01L 23/00* (2006.01)

(52) U.S. Cl.
CPC .............. *H01L 24/13* (2013.01); *H01L 24/27* (2013.01); *H01L 24/33* (2013.01); *H01L 2224/16235* (2013.01)

(58) Field of Classification Search
None
See application file for complete search history.

(56) References Cited

U.S. PATENT DOCUMENTS

2007/0069336 A1 3/2007 Ning

*Primary Examiner* — Hrayr A Sayadian
(74) *Attorney, Agent, or Firm* — Horizon IP Pte Ltd.

(57) ABSTRACT

A seal ring structure is disclosed for integrated circuit (IC) packaging. The seal ring includes an inner moisture barrier ring and an outer crack stop ring. Line structures of both the inner and outer rings include chamfered corners. The chamfers of a chamfered corner are devoid of acute angles. No metal line structure for the inner ring is provided at the pad level. The seal ring as described improves the reliability and strength of the structure and hence the seal ring can sustain high stress at the corners of the die during dicing.

20 Claims, 6 Drawing Sheets

ROBUST CHAMFER DESIGN FOR SEAL RING

BACKGROUND

Integrated circuits (IC) are fabricated on a wafer in parallel. After processing, the wafer is diced to singulate the dies into individual chips. As part of processing the ICs, seal rings are formed in the back-end-of-line (BEOL) dielectric. A seal ring surrounds an IC to protect the IC from damage by saw-induced cracks propagating into the IC as well as moisture absorption.

However, conventional seal ring designs lead to defects from packaging of the IC. For example, resist bubbles are formed at corners of the seal ring. This causes defects in the packaging process, such as under-bump due to poor seed layer coverage.

The present disclosure is directed to ICs with an improved seal ring design for semiconductor devices.

SUMMARY

A semiconductor device is disclosed. The semiconductor device includes a substrate which includes a prime region having circuit components, a seal region surrounding the prime region and a kerf region. The device further includes a back-end-of-line (BEOL) dielectric disposed on the substrate covering the prime region with the circuit components, the seal ring region and the kerf region. The BEOL dielectric includes a plurality of ILD levels, an ILD level of the ILD levels includes a via dielectric level with via contacts and a metal dielectric level with metal lines. The metal lines and the via contacts of the ILD levels interconnect the circuit components of the prime region. A bottom ILD level is a first ILD level of the BEOL dielectric, one or more intermediate ILD levels is disposed above the bottom ILD level, and a top ILD level is disposed above the intermediate ILD levels. A top metal level of the top ILD level serves as a pad level with pads. A seal ring is disposed in the BEOL dielectric over the seal ring region of the substrate, the seal ring includes an inner moisture oxygen barrier (MOB) ring adjacent to the prime region and an outer crack stop (CS) ring adjacent to the kerf region. The MOB ring includes MOB metal level metal line structures disposed in metal dielectric levels of the ILD levels except the top metal dielectric level and MOB via level metal line structures disposed in via dielectric levels of the ILD levels. The MOB metal level metal line structures and the MOB via level metal line structures include MOB chamfered corners which are devoid of acute angles. The CS ring includes CS metal level metal line structures disposed in metal dielectric levels of the ILD levels and CS via level metal line structures disposed in via dielectric levels of the ILD levels. The CS metal level metal line structures and the CS via level metal line structures include CS chamfered corners which are devoid of acute angles.

In another embodiment, a method of forming a device is described. The method includes providing a substrate which includes a prime region having circuit components, a seal region surrounding the prime region and a kerf region. The method further includes forming a back-end-of-line (BEOL) dielectric disposed on the substrate covering the prime region with the circuit components, the seal ring region and the kerf region. The BEOL dielectric includes a plurality of ILD levels, an ILD level of the ILD levels includes a via dielectric level with via contacts and a metal dielectric level with metal lines. The metal lines and the via contacts of the ILD levels interconnect the circuit components of the prime region. A bottom ILD level is a first ILD level of the BEOL dielectric, one or more intermediate ILD levels is disposed above the bottom ILD level, and a top ILD level is disposed above the intermediate ILD levels. A top metal level of the top ILD level serves as a pad level with pads. A seal ring is formed in the BEOL dielectric over the seal ring region of the substrate, the seal ring includes an inner moisture oxygen barrier (MOB) ring adjacent to the prime region and an outer crack stop (CS) ring adjacent to the kerf region. The MOB ring includes MOB metal level metal line structures disposed in metal dielectric levels of the ILD levels except the top metal dielectric level and MOB via level metal line structures disposed in via dielectric levels of the ILD levels. The MOB metal level metal line structures and the MOB via level metal line structures include MOB chamfered corners which are devoid of acute angles. The CS ring includes CS metal level metal line structures disposed in metal dielectric levels of the ILD levels and CS via level metal line structures disposed in via dielectric levels of the ILD levels. The CS metal level metal line structures and the CS via level metal line structures include CS chamfered corners which are devoid of acute angles.

In yet another embodiment, a semiconductor device is disclosed. The device includes a substrate which includes a prime region having circuit components, a seal region surrounding the prime region and a kerf region. The device further includes a back-end-of-line (BEOL) dielectric disposed on the substrate covering the prime region with the circuit components, the seal ring region and the kerf region. The BEOL dielectric includes a plurality of ILD levels, an ILD level of the ILD levels includes a via dielectric level with via contacts and a metal dielectric level with metal lines. The metal lines and the via contacts of the ILD levels interconnect the circuit components of the prime region. A bottom ILD level is a first ILD level of the BEOL dielectric, one or more intermediate ILD levels is disposed above the bottom ILD level, and a top ILD level is disposed above the intermediate ILD levels. A top metal level of the top ILD level serves as a pad level with pads. A seal ring is disposed in the BEOL dielectric over the seal ring region of the substrate, the seal ring includes an inner moisture oxygen barrier (MOB) ring adjacent to the prime region and an outer crack stop (CS) ring adjacent to the kerf region. The MOB ring includes MOB metal level metal line structures disposed in metal dielectric levels of the ILD levels and MOB via level metal line structures disposed in via dielectric levels of the ILD levels. The MOB metal level metal line structures and the MOB via level metal line structures include MOB chamfered corners which are devoid of acute angles. The CS ring includes CS metal level metal line structures disposed in metal dielectric levels of the ILD levels and CS via level metal line structures disposed in via dielectric levels of the ILD levels. The CS metal level metal line structures and the CS via level metal line structures include CS chamfered corners which are devoid of acute angles.

These and other objects, along with advantages and features of the present invention herein disclosed, will become apparent through reference to the following description and the accompanying drawings. Furthermore, it is to be understood that the features of the various embodiments described herein are not mutually exclusive and can exist in various combinations and permutations.

BRIEF DESCRIPTION OF THE DRAWINGS

In the drawings, like reference characters generally refer to the same parts throughout the different views. Also, the drawings are not necessarily to scale, emphasis instead generally being placed upon illustrating the principles of the invention. In the following description, various embodiments of the present invention are described with reference to the following drawings, in which.

DETAILED DESCRIPTION

Embodiments generally relate to methods and devices for forming a robust chamfer design for a seal ring. More particularly, the present invention is generally related to a seal ring which includes an inner ring and an outer ring. For example, the inner ring is a moisture oxidation barrier (MOB) and the outer ring is a crack stop (CS). The seal ring may be used in any type of packages or packaging processes.

Figure 1:
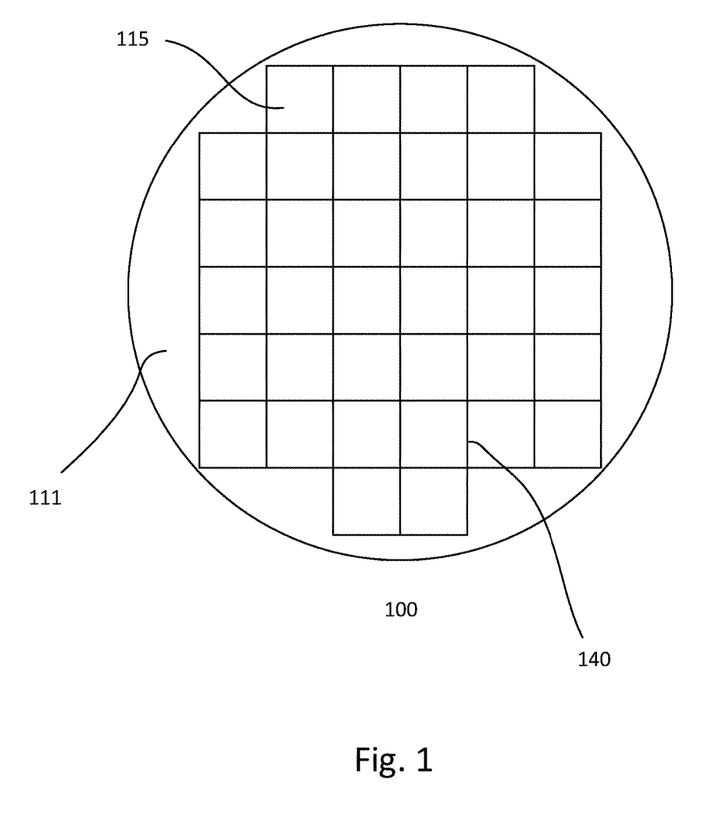
FIG. 1 shows a top plan view of a semiconductor wafer.

FIG. 1 shows a top plan view of a semiconductor wafer. The semiconductor wafer 100, for example, may be a silicon wafer. Other types of wafers are also useful. For example, the wafer may be a p-type, n-type, silicon-on-insulator (SOI) or silicon germanium wafer.

Front-end-of-line (FEOL) processing is performed on a surface of the wafer. For example, FEOL processing is performed on an active surface 111 of the wafer. The FEOL processing forms circuit components, such as transistors. Other types of circuit components may also be formed by FEOL processing. After FEOL processing, back-end-of-line (BEOL) process is performed. The BEOL processing forms a BEOL dielectric having a plurality of ILD levels, each with a via level dielectric with via contacts and a metal level dielectric with metal lines. The various ILD levels provide interconnections for the circuit components to form the ICs. A top metal level may be a pad level with contact pads to provide external connections to the ICs. A passivation layer may be disposed over the pad level. The passivation layer may be opened to expose the contact pads. The pad level may include a redistribution layer (RDL) for positioning the pads as desired.

As discussed, a plurality of ICs 115 is formed on the wafer in parallel. As shown, the ICs are rectangular or square shaped ICs arranged in rows and columns. Since the wafer is circular in shape, the ICs are arranged to maximize the number of ICs on the wafer. Between the rows and columns of ICs is a kerf region 140. The kerf region is sufficiently wide to accommodate a wafer saw used to dice the wafer. This avoids damaging circuit components of ICs.

Furthermore, a device may include a seal ring in a seal ring region between a prime region and the kerf region of a device. The prime region of a device contains the various circuit components and interconnections. A seal ring may include an inner ring serving as a moisture oxidation barrier (MOB) and an outer ring serving as a crack stop (CS). The MOB and CS are designed to minimize the risk of moisture absorption in the prime region, particularly in the case of low-k dielectric ILD layers where cracks caused by dicing the wafer from permeating into the prime region damage the device. The seal ring may also provide a low resistance path to ground for protection against a surge current caused by electrostatic discharge (ESD).

The present seal ring is applicable to various types of IC packages or package processes. For example, the seal ring may be used in various types of wafer level as well as non-wafer level packages or package processes. Examples of various types of wafer level and non-wafer level packages include flip chip, fan-in, fan-out, and also different types of packages with bonds or wire bonds.

Figure 2A:
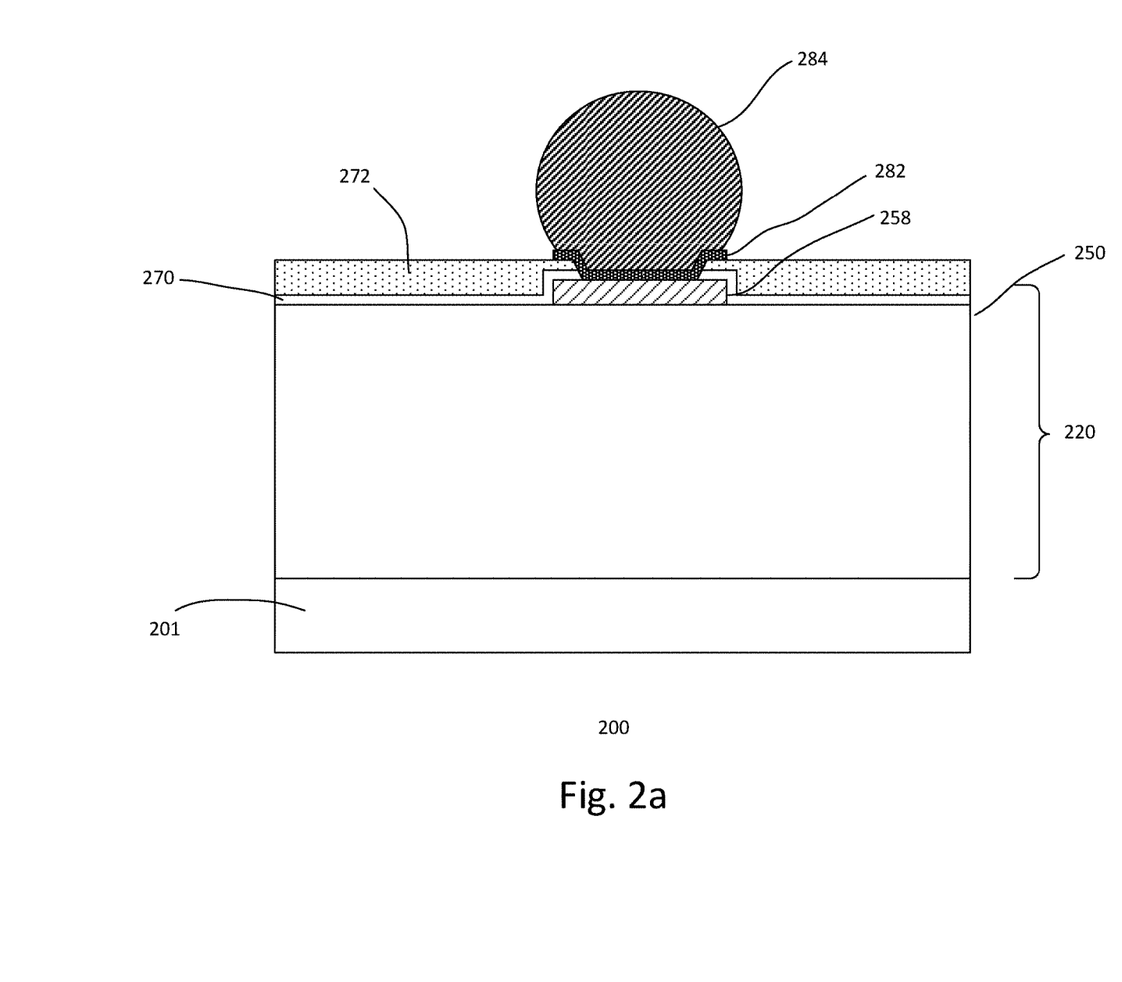
FIGS. 2a-b show simplified embodiments of devices with a WLCSP.
Figure 2B:
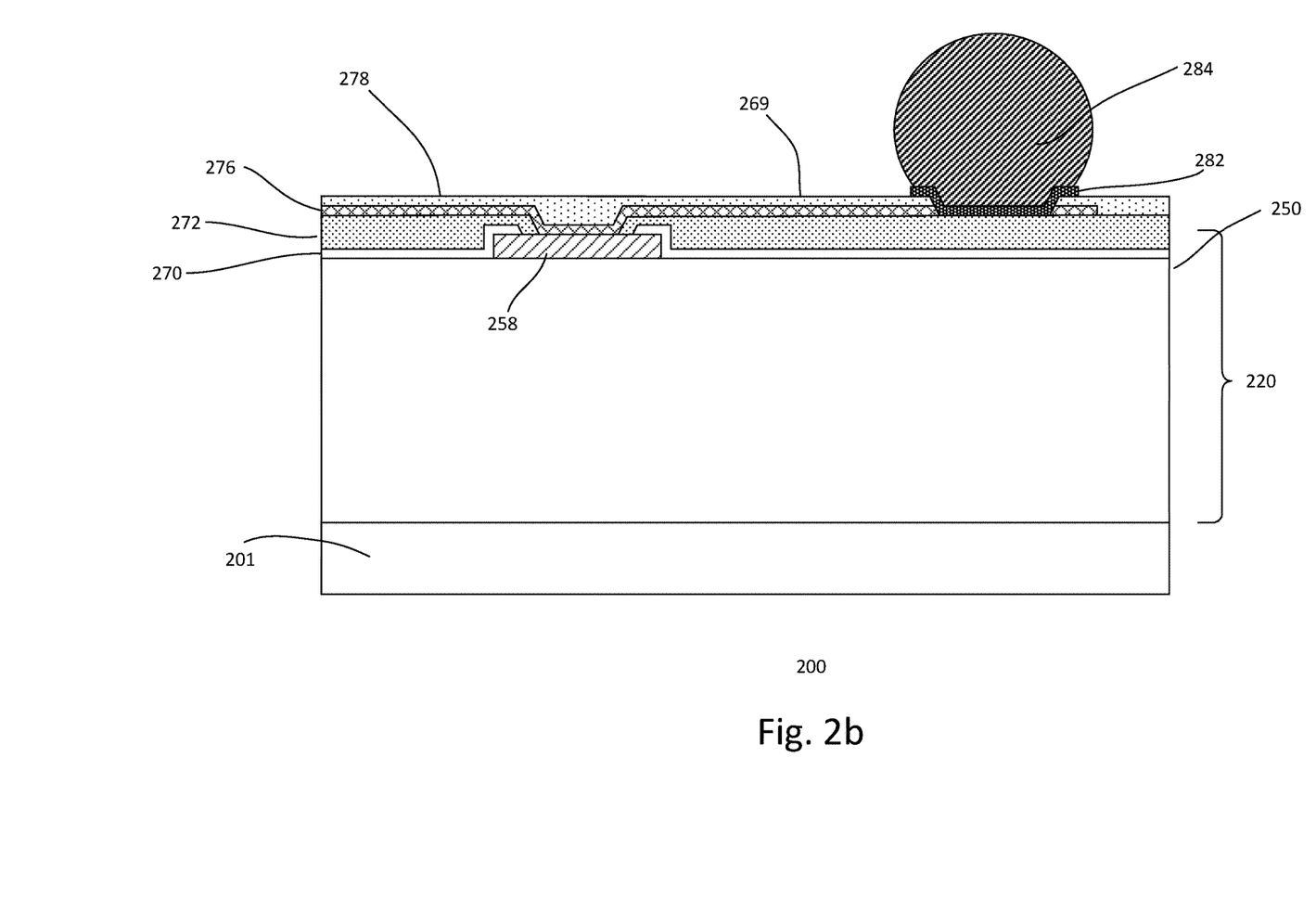

For illustration purposes, FIGS. 2a-b shows an example of a IC package or package process. For example, FIGS. 2a-b show that the seal ring is applicable for ICs with wafer level chip scale package (WLCSP). However, it is understood that the seal ring may be used for various types of IC package processes. In one embodiment, as part of BEOL processing, WLCSP processing may be performed. WLCSP includes, for example, forming contact bumps, such as solder bumps, which are electrically coupled to pads in the pad level. FIGS. 2a-b show various simplified embodiments 200 of a portion of a wafer with a contact bump formed by WLCSP packaging. As shown, the wafer only includes one contact pad with a contact bump. It is understood that the wafer may include a plurality of devices with a plurality of contact pads and contact bumps.

Referring to FIG. 2a, an active surface of a wafer 201 is processed with FEOL components. A BEOL dielectric 220 is disposed on the active surface of the wafer with the FEOL circuit components, such as transistors. Other types of circuit components may also be useful. The BEOL dielectric includes a plurality of ILD levels, each with a via level dielectric with via contacts and a metal level dielectric with metal lines. The various ILD levels provide interconnections for the circuit components to form the ICs. The metal lines and contacts may be formed using a single or dual damascene process. In the case of a single damascene process, the contacts and metal lines are formed in separate processes. In the case of a dual damascene process, the metal lines and contacts are formed in the same process. In some embodiments, metal lines may be formed using a reactive-ion etching (ME) process. For example, a metal layer is formed and patterned to form metal lines. The different ILD layers may employ different processes. For example, one ILD layer may employ single damascene, another layer may employ dual damascene, and yet another layer may employ single damascene to form contacts and RIE to form metal lines. Furthermore, it is understood that not all the ILD levels need to include the same conductive material.

A top metal level 250 of the BEOL dielectric may be a pad level. A pad dielectric level may include a pad via dielectric (not shown in detail). The pad via dielectric, for example, may be silicon oxide. Other types of pad dielectric may also be useful. Pad via contacts and contact pads 258 are disposed above the pad via dielectric level to provide external connections to the ICs. A contact pad is coupled to a pad via contact below (not shown). In some embodiments, the contact pad and pad via contact may be formed by ME process. For example, a conductive pad layer, such as aluminum (Al), may be formed on the substrate, lining the surface of the pad via dielectric and pad via openings. Other types of conductive pad layers may also be useful. The pad layer may be patterned using a ME process, forming pad via contacts in the pad via openings and pad contacts on the surface of the pad via dielectric. Other techniques for forming the contact pads may also be useful.

A passivation layer 270 is disposed over the pad level, covering the pad contacts. The passivation layer may be a dielectric layer, such as silicon oxide or silicon nitride. In some embodiments, the passivation layer may include a passivation stack having a plurality of dielectric layers. For example, the passivation layer may include a silicon oxide or silicon nitride stack, where the silicon oxide layer is disposed below the silicon nitride. Other types of passivation layers or stacks may also be useful.

A dielectric layer 272 may be disposed over the passivation layer. The dielectric layer may be an oxide nitride layer. Other types of dielectric layers may also be useful.

The dielectric and passivation layers are patterned to provide openings to expose the contact pads 258. Patterning the passivation layer may be achieved by exposing the dielectric layer with an exposure source using a reticle with the desired pattern. After exposure, the dielectric layer is developed to transfer the pattern of the reticle thereto.

A UBM liner 282 is formed on the substrate. The UBM liner may be a UBM liner stack having a plurality of layers. The UBM stack may include a plurality of metal layers or alloys. The various layers serve different purposes. For example, the bottom or lower layers may serve to promote adhesion between the contact bump and contact pad, middle or intermediate layers may serve as diffusion barriers to prevent interaction between the contact bump and contact pad, while the top or upper layers may serve to promote wetting of the contact bump. In some cases, the diffusion barrier may also serve as an adhesion promoting layer. The types or configurations of layers may depend on the contact bump and the underlying contact pad. The layers of the UBM liner may be formed by sputtering. Other techniques for forming the UBM liners may also be useful.

As shown, the UBM liner is patterned to line the pad openings and the surface of the dielectric layer adjacent to the pad openings. The UBM layer may be patterned using mask and etch techniques, for example, using a patterned resist mask and etching the UBM liner with a RIE. Contact bumps 284 are formed on the UBM liners. For example, solder bumps may be formed on the UBM liner by reflowing. Other types of contact bumps or forming techniques may also be useful.

Referring to FIG. 2b, another simplified embodiment 200 of a portion of a wafer with a contact bump formed by WLCSP packaging. The embodiment is similar to that described in FIG. 2a. Common elements may not be described in detail.

As shown, contact pads 258 are provided in a pad level of the BEOL dielectric 220 on a wafer 201 processed with FEOL circuit components. The contact pads are covered with a passivation layer 270 and a dielectric layer 272. The passivation layer and the dielectric layer include pad openings to expose the contact pads.

A conductive layer, such as a copper or copper alloy layer, is formed on the dielectric layer. The conductive layer lines the pad openings and dielectric layer. The conductive layer is patterned to form a redistribution layer (RDL) 276. Patterning the conductive layer may be using etch and mask techniques, such as a patterned resist mask serving as an etch mask for a RIE. The RDL includes various RDL lines with RDL contact pads on which the contact bumps are located. The RDL lines are coupled to the contact pads. For example, the RDL displaces the locations of the contact bumps from the locations of the pad contacts.

A RDL dielectric layer 278 is formed on the substrate. The RDL dielectric layer may be a polyimide layer. For example, the RDL dielectric layer may be a self-planarizing photosensitive polyimide layer. Other types of dielectric layers may also be useful. The RDL dielectric layer is patterned to form RDL pad openings to expose RDL contact pads.

A UBM liner 282 is formed on the substrate, covering the RDL dielectric layer and RDL contact openings. The UBM liner is patterned to form UBM contacts in the RDL contact pad openings. As shown, a UBM contact lines the RDL contact pad opening and the surface of the RDL dielectric layer adjacent to the openings. Contact bumps 284 may be formed on the UBM liners.

After processing of the wafer is completed, it is diced along a kerf region of the wafer to singulate the ICs into individual dies. As discussed, an IC may be provided with a seal ring to minimize the risk of moisture absorption in the prime region, particularly in the case of low-k dielectric ILD layers where cracks caused by dicing the wafer from permeating into the prime region damage the device.

Figure 3A:
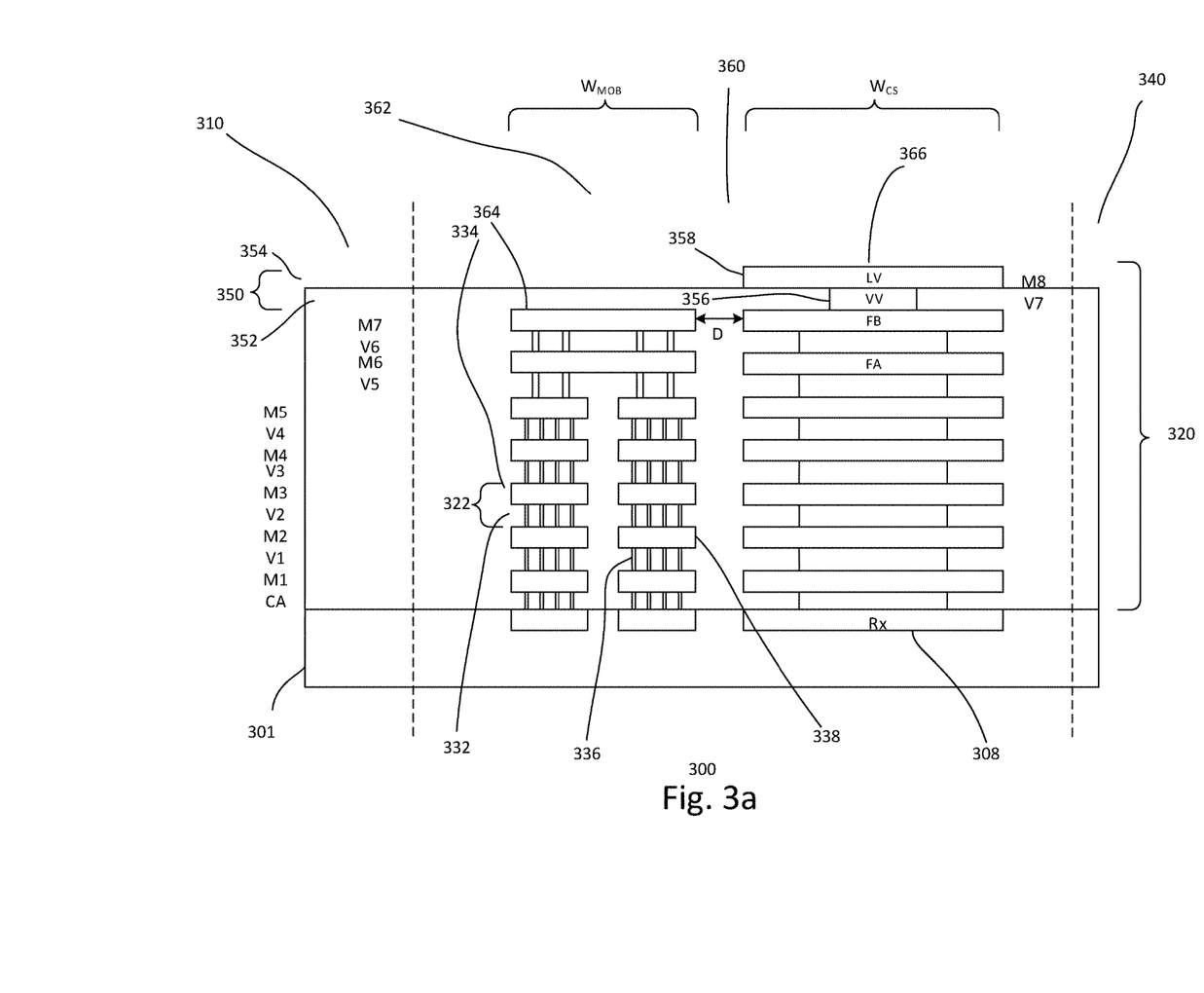
FIGS. 3a-c show cross-sectional and top views of a simplified embodiment of a seal ring.
Figure 3B:
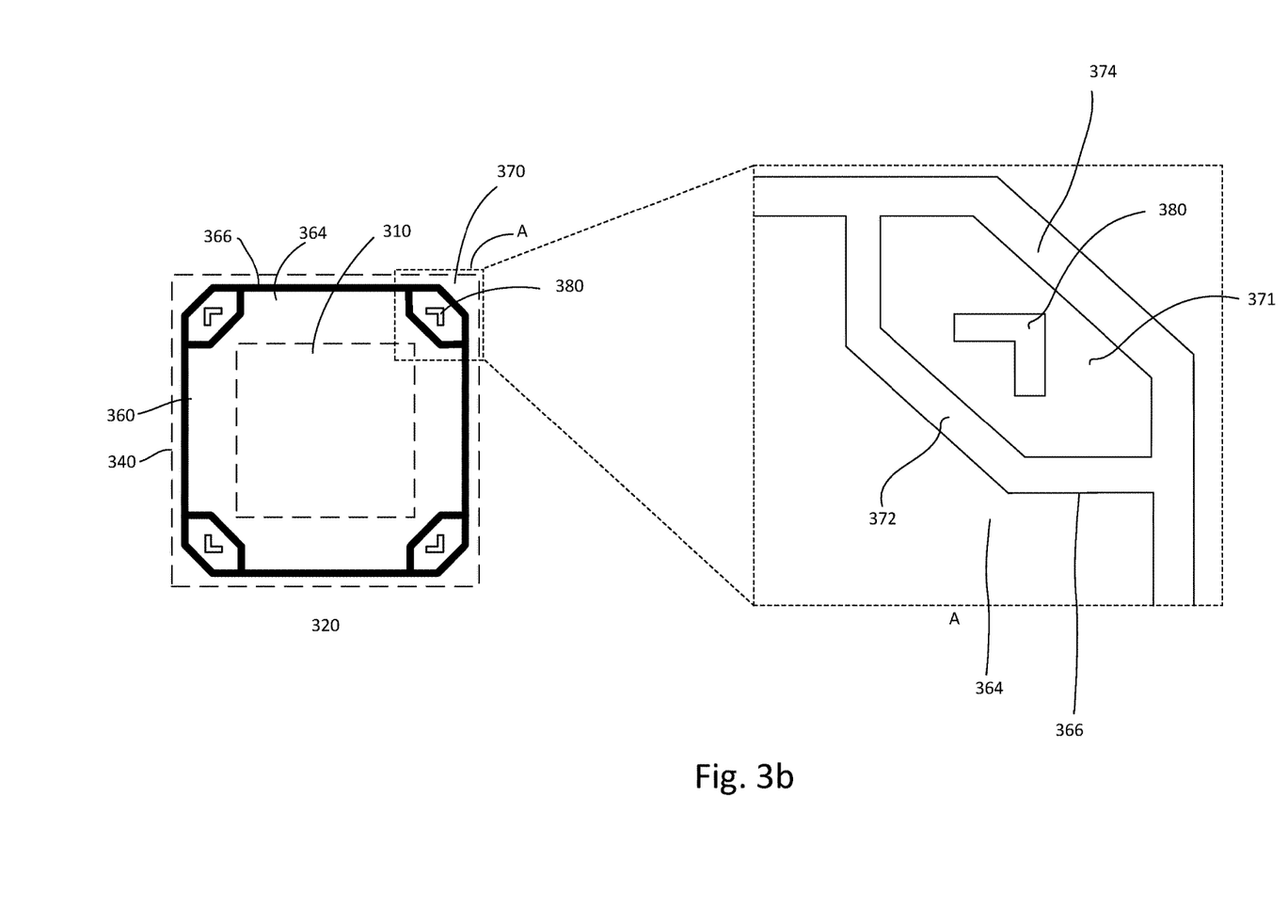
Figure 3C:
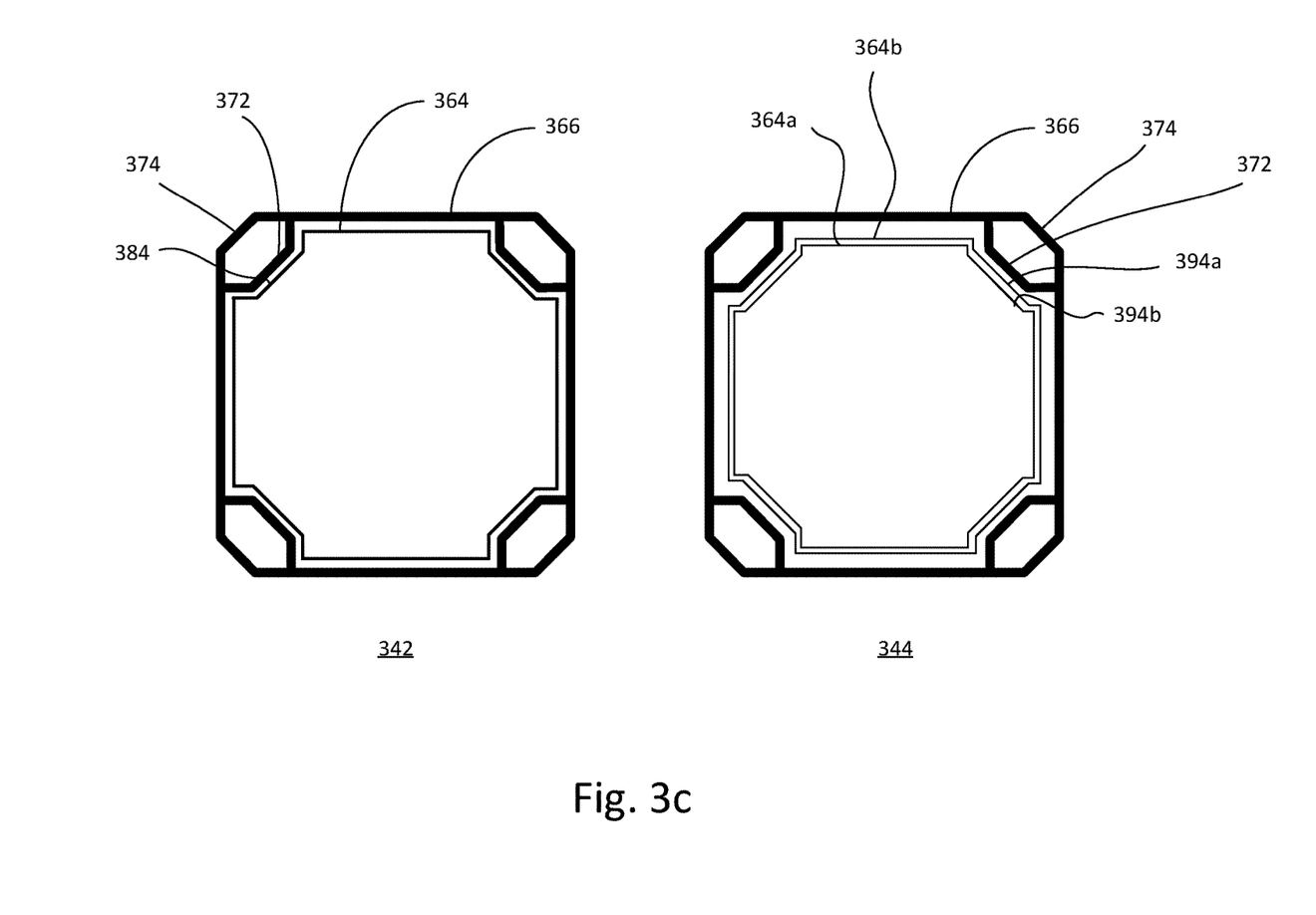

FIGS. 3a-c show different views of an embodiment of a seal ring of a device. FIG. 3a shows a simplified cross-sectional view of an embodiment of a seal ring 300 of a device; FIG. 3b shows a simplified top view and a zoom-in top view of a top level of the seal ring of the device; and FIG. 3c show simplified top views of for different ILD levels of the seal ring of the device. The embodiments shown in FIG. 1, 2a-b and 3a-3c are similar. Common elements may not be described in detail.

As shown in FIG. 3a, the device includes a prime region 310, a seal ring region 360 and a kerf region 340. The seal ring region surrounds the prime region of the device. The seal ring region is disposed between the prime region and the kerf region. The prime region includes FEOL circuit components of the device as well as interconnections in a BEOL dielectric 320. For example, the FEOL circuit components (not shown) are formed on an active surface of a wafer 301 and the BEOL dielectric is formed on the active surface, covering the FEOL circuit components. As for the kerf region, it is the region separating adjacent ICs and provides a region for a saw used to dice the wafer to singulate the devices. In some instances, the kerf region may include test structures which will be destroyed by dicing.

As shown, the wafer 301 includes active regions of the device. The active regions, for example, may be doped regions on the wafer. The doped regions may be heavily doped regions. The doped regions may include first and second polarity type doped regions. The doped regions may, for example, serve as contact regions on the wafer. The doped regions may be referred to as Rx regions. Other types of contact regions, such as gate conductors or elevated S/D regions, may also be included.

A BEOL dielectric 320 is disposed on the active surface of the substrate. The BEOL dielectric covers the circuit components as well as the Rx regions. The BEOL dielectric includes a plurality of ILD levels 322. An ILD layer includes a metal level dielectric 334 over a contact level dielectric 332. The metal and contact level dielectrics may be silicon oxide. For example, the silicon oxide may be TEOS formed by chemical vapor deposition (CVD). Providing low k, a combination of low k and TEOS, high k or other dielectrics for the metal and contact level dielectrics may also be useful. The BEOL dielectric may include dielectric etch stop liners between ILD levels or between metal level and contact level dielectrics. Other configurations of BEOL dielectrics may also be useful.

Generally, a metal level dielectric includes conductors or metal lines 338 while the contact level dielectric includes via contacts 336. The conductors and contacts may be formed of a metal, such as copper, copper alloy, aluminum, tungsten or a combination thereof. Other suitable types of metal, alloys or conductive materials may also be useful. In some cases, the conductors and contacts may be formed of the same material. For example, in upper metal levels, the conductors and contacts may be formed by dual damascene processes. This results in the conductors and contacts having the same material. In some cases, the conductors and contacts may have different materials. For example, in the case where the contacts and conductors are formed by single damascene processes, the materials of the conductors and contacts may be different. Other techniques, such as reactive ion etch (ME) may also be employed to form metal lines.

As discussed, the BEOL includes a plurality of ILD levels. For example, x number of ILD levels may be provided. As illustrated, the device includes 8 ILD levels (x=8). Other numbers of ILD levels may also be useful. The numbers of ILD levels may depend on, for example, design requirement or the logic process involved. A metal level of an ILD level may be referred to as $M_i$, where i is from 1 to x and is the $i^{th}$ ILD level of x ILD levels. A contact level of an ILD level may be referred to as $V_{i-1}$, where i is the $i^{th}$ ILD level of x ILD levels.

The process of forming the BEOL dielectric may include forming a dielectric layer over the FEOL circuit components, such as transistors and other circuit components. The dielectric layer may be silicon oxide. For example, the dielectric layer may be silicon oxide formed by chemical vapor deposition (CVD). Other types of dielectric layer formed by other processes may also be useful. The dielectric layer serves as a pre-metal dielectric layer or first contact layer of the BEOL dielectric. The dielectric layer may be referred to as CA level of the BEOL dielectric. Contacts are formed in the CA level dielectric layer. The contacts may be formed by a single damascene process. For example, via openings are formed in the dielectric layer using mask and etch techniques. For example, a patterned resist mask with openings corresponding to the vias is formed over the dielectric layer. An anisotropic etch, such as RIE, is performed to form the vias, exposing contact regions below, such as S/D regions and gates. A conductive layer, such as tungsten, is deposited to cover the CA dielectric and filling the openings. The conductive layer may be formed by sputtering. Other techniques may also be useful. A planarization process, such as CMP, is performed to remove excess conductive materials, leaving contact plugs in the CA level.

After forming contacts in the CA level, the process continues to form a dielectric layer over the wafer, covering the CA level dielectric layer. The dielectric layer, for example, serves as a first metal level M1 of the first ILD level. The metal level dielectric layer, for example, is a silicon oxide layer. Other types of dielectric layers may also be useful. The dielectric layer may be formed by CVD. Other techniques for forming the dielectric layer may also be useful.

Conductive lines are formed in the M1 level dielectric layer. The conductive lines may be formed by a damascene technique. For example, the dielectric layer may be etched to form trenches or openings using, for example, mask and etch techniques. A conductive layer is formed on the substrate, filling the openings. For example, a copper or copper alloy layer may be used to fill the openings. The conductive material may be formed by, for example, plating, such as electro or electroless plating. Other types of conductive layers or forming techniques may also be useful. Excess conductive materials are removed by, for example, chemical mechanical planarization (CMP), leaving a planar surface with M1 dielectric. The first metal level M1 and CA may be referred as the first ILD level.

The process continues to form additional ILD levels. For example, the process continues to form additional ILD levels above the first or bottom ILD level. The additional ILD levels may include, for example, lower intermediate and upper intermediate ILD levels and a top ILD level. The additional ILD levels may include ILD level 2 to ILD level x. For example, in the case where x=8 (8 levels), the additional levels include ILD levels from 2 to 8, which include via levels V1 to V7 and metal levels M2 to M8. In one embodiment, the lower and upper intermediate ILD levels have different design rules. For example, the design rules for the lower intermediate ILD levels (e.g., 2-5) may be the same as the first ILD level while the upper intermediate ILD levels (e.g., 6-8) includes larger design rules. For example, upper intermediate ILD levels 6-8 may have a larger CD than metal levels M1 to M5 below. The CD of upper ILD levels may be about 2× or 6× the CD of the metal levels below. Other configurations of the ILD levels may also be useful.

Furthermore, the uppermost or top ILD level serves as a pad level 350 of the device. ILD levels 6 and 7 may be referred to as fat wire levels. For example, M6 may be referred to as FA and M7 may be referred to as FB. As for the pad level, the pad via level may be referred to as VV and the contact pad level may be referred to as LV.

The number of ILD levels may depend on, for example, design requirement or the logic process involved. The additional ILD level may be formed of silicon oxide. Other types of dielectric materials, such as low k, high k or a combination of dielectric materials may also be useful. The ILD layers may be formed by, for example, CVD. Other techniques for forming the ILD layers may also be useful.

The conductors and contacts of the lower and upper intermediate ILD layers (e.g., except for the pad level) may be formed by dual damascene techniques. For example, vias and trenches are formed, creating dual damascene structures. The dual damascene structure may be formed by, for example, via first or via last dual damascene techniques. Mask and etch techniques may be employed to form the dual damascene structures. The dual damascene structures are filled with a conductive layer, such as copper or copper alloy. Other types of conductive materials may also be useful. The conductive layer may be formed by, for example, plating techniques. Excess conductive materials are removed by, for example, CMP, forming conductors and contacts in an upper ILD layer. Other types of dielectric materials, such as low k, high k or a combination of dielectric layers may also be useful.

A dielectric liner (not shown) may be disposed between ILD levels. The dielectric liner, for example, serves as an etch stop layer. The dielectric liner may be formed of a low k dielectric material. For example, the dielectric liner may be nBLOK. Other types of dielectric materials for the dielectric liner may also be useful.

As for the pad level 350, as discussed, it includes the pad via dielectric level 352 and a pad contact level 354. The pad via dielectric level 356 includes via contacts VV and the pad contact level 358 includes pad contacts LV. The via contacts VV and pad contacts LV may be Al via contacts and Al pad contacts. Other types of conductive via contacts and contact pads may also be useful. In one embodiment, the via contacts VV and pad contacts LV are formed by RIE. For example, vias openings are formed in the via dielectric level 356 to expose metal lines below. A pad contact layer 358, such as Al, is deposited on the pad via dielectric, covering the pad via dielectric and lining the openings. A mask and etch process using a patterned resist mask and a RIE is performed to pattern the pad contact layer to form pad contacts.

A passivation layer (not shown) may be formed over the pad via dielectric and pad contacts. The passivation layer lines the pad via dielectric and pad contacts. In one embodiment, the passivation layer is a passivation stack having a plurality of dielectric layers. In one embodiment, the passivation stack is a silicon oxide or silicon nitride stack. In another embodiment, the passivation stack includes RDL and RDL dielectric. A dielectric layer, such as a polyimide layer, may be formed over the passivation layer. The polyimide layer may be a self-planarizing photosensitive layer.

Pad openings are formed in the dielectric and passivation layers to expose the bond pad for forming contact bumps. For example, a UBM liner may be formed on the substrate and patterned to form UBM contact lines on the contact pads on which contact bumps are formed. In some embodiments, a RDL layer and RDL dielectric may be formed after pad opening, following by forming RDL openings, UBM contact liners and contact bumps.

The various components of the BEOL dielectric are not shown in the prime region for simplification. However, it is understood that the prime region includes the various interconnections.

As discussed, the BEOL dielectric includes a seal ring 362 in the seal ring region 360 between the prime region 310 and the kerf region 340. The seal ring, in one embodiment, includes an inner seal ring 364 and an outer seal ring 366. The inner seal ring is adjacent to the prime region while the outer seal ring is adjacent to the kerf region. The inner seal ring serves as a moisture oxidation barrier (MOB) ring while the outer seal ring serves as a crack stop (CS) ring.

The inner and outer rings include metal structures in the ILD levels of the BEOL dielectric. For example, the inner ring includes metal line structures in metal dielectric levels of the BEOL dielectric and via line structures in the via dielectric levels of the BEOL dielectric.

In one embodiment, the inner ring 364 in the bottom and lower intermediate ILD levels have first and second line structures in the metal levels and multiple via line structures disposed between line structures of adjacent metal levels. For example, M1, M2, M3, M4 and M5 each includes first and second line levels while CA, V1, V2, V3 and V4 each includes multiple via line structures disposed between line structures of adjacent metal levels. The line structures as shown, are wider than the via line structures.

As for the upper intermediate ILD levels (excluding the pad level), the metal levels each includes a single line structure and the via levels each includes first and second via line structures. For example, FA and FB each includes a single line structure while V5 and V6 each includes 2 via line structures. Other configurations of line structures and via line structures for the different ILD levels may also be useful. As shown, not all levels of the MOB ring are symmetrical. The bottom and intermediate ILD levels are symmetrical and the upper ILD levels are symmetrical, but the bottom and intermediate ILD levels are not symmetrical with the upper ILD levels.

In one embodiment, no line structure or via line structure are provided for the inner ring 364 in the pad level 350. For example, no via line structure is provided in the pad via dielectric level and no line structure is provided in the pad contact level above the pad via dielectric level.

As for the outer seal ring 366, it includes lines and via structures in the ILD levels of the BEOL dielectric, including the pad level 350. For example, via line structures are provided in the via dielectric levels of the BEOL dielectric and line structures are provided in the line dielectric levels of the BEOL dielectric. The line structures as shown, are wider than the via line structures. This creates a line structure in which the inner ring seal and outer ring seal are asymmetrical in height. For example, the height of the inner seal ring is from $ILD_1$-$ILD_{x-1}$ while the height of the inner seal ring is from $ILD_1$-$ILD_x$, where x is the pad level and x-1 is the ILD level below the pad level.

The width of the CS ring should be sufficient to prevent cracks from permeating through to the MOB ring. As for the MOB ring, it should be sufficiently wide to prevent moisture and oxygen from penetrating into the prime region. As discussed, the line structures of the rings are wider than the via line structures. As shown, a width $W_{MOB}$ (line structures) of the inner or MOB ring is less than a width $W_{CS}$ (line structures) of the outer or CS ring. The width $W_{MOB}$ and $W_{CS}$ may vary depending on the design rule. Other configurations of the widths of the MOB and CS rings may also be useful.

As discussed, the bottom and intermediate (lower and upper intermediate) ILD levels of the MOB ring may include first and second metal level line structures while the upper ILD levels, except for the pad level, each includes one metal level line structure. The MOB ring structures of the different metal levels, as shown, have about the same width. For example, a double line structure, including the space, of the metal levels of the bottom and lower intermediate ILD levels may be about the same as the single line structure of the metal levels of the upper intermediate ILD levels. In addition, the via levels of the bottom and lower intermediate ILD levels include 4 via level line structures for each of the metal level line structures while the via levels in the upper intermediate ILD levels include 4 via level line structures. For example, V5 may include 2 via line structures coupling to each of the two metal level line structures of M5 below. As for the CS ring structures, as shown, they include metal level line structures of the different ILD levels having the same width and via level line structures of the different ILD levels having the same width. The metal level line structures are wider than the via level line structures. Furthermore, the metal level line structures of the CS ring are wider than the metal level line structures of the MOB ring. Other configuration of the via and metal level line structures of the MOB and CS rings may also be useful.

The MOB and CS rings may be formed using current BEOL process. For example, the various structures of the ring are formed using the same masks and, processes and materials as those used in forming the BEOL in the prime region.

FIG. 3b shows a top view 320 of the uppermost ILD level of a device 320. For example, the top view is of the pad level. The device includes a prime region 310, a seal ring region 360 with a seal ring surrounding the prime region, and a kerf region 340 surrounding the seal ring region. As discussed, the seal ring includes an outer CS ring 366 and an inner MOB ring. In one embodiment, the uppermost level includes a metal line structure of the CS ring. The uppermost level, however, does not include a metal line structure of the MOB ring. The line structure includes chamfered corners 370.

As shown, a chamfered corner includes inner and outer chamfers 372 and 374. The inner and outer chamfers form a chamfer cavity 371 at the corners of the line structure. A marker 380 may be formed in the chamfer cavity 371 at the corners of the line structure. The marker 380 may be a marker for a scanning machine. The marker is illustrated as a L-shaped marker. It is understood that the marker may be formed in various shapes or patterns, such as cheese pattern.

The chamfers of a chamfered corner are devoid of acute angles. For example, the inner and outer angles of the chamfers have ≥ than 90° angles. Providing chamfers with no acute angles reduce the formation of resist bubbles. For example, the inner and outer chamfers include internal angles which are ≥90°. In other words, the inner and outer chamfers are devoid of acute angles which are <90°.

In one embodiment, as shown in the zoom-in view A, the inner and outer chamfers form a hexagonal shaped chamfer at the corners of the line structure. For example, the intersections of the inner and outer chamfers form 90° angles while the other internal angles of the chamfers are 135° angles. Other configuration of chamfered corners may also be useful. For example, the inner and outer chamfers may form other polygonal shaped chamfers at the corners of the line structure, such as a pentagonal or an octagonal shaped chamfer. The polygonal shaped chamfer may be a symmetrical polygon or an asymmetrical polygonal. The via line structure below may have the same pattern but a thinner width.

FIG. 3c show top views of seal rings of metal levels for different ILD levels. For example, seal ring 342 is for the metal levels of the upper intermediate ILD levels while seal ring 344 is for the metal levels of the bottom and lower intermediate ILD levels.

As shown, the seal ring 342 for the metal levels of the upper intermediate ILD levels includes metal level line structures 364 and 366 for the inner MOB and outer CS rings. The metal level line structure of the CS ring is similar to that described for the upper most ILD level. As for the metal level line structure of the MOB ring, it follows the pattern of the metal level line structure of the CS ring. For example, the chamfer 384 of the metal level line structure of the MOB ring follows the pattern of the inner chamfer 372 of the metal level line structure of the CS chamfered corners. Like the CS ring, the line structure of the MOB ring is devoid of acute angles. The via level below has the same or similar pattern as the metal level.

As for seal ring 344 for the metal levels of the bottom and lower intermediate ILD levels, it is similar to the seal ring 342 except that the inner MOB ring includes first and second metal level line structures 364a-b. The chamfers 394a-b of the metal level line structure of the MOB ring follow the pattern of the inner chamfer 372 of the metal level line structure of the CS chamfered corners. The via level below has the same or similar pattern as the metal level.

The embodiments as described result in various advantages. For example, the inner ring with no line structure at the pad level lowers the risk of forming bubbles at or underneath the metal levels by reducing the gap depth between the inner and outer rings. Furthermore, the chamfers of a chamfered corner avoid <90° angled corners which may reduce the formation of resist bubbles. The embodiments as described improve the reliability and strength of the seal ring structure and hence the seal ring can sustain high stress at the corners of the die during dicing.

The present disclosure may be embodied in other specific forms without departing from the spirit or essential characteristics thereof. The foregoing embodiments, therefore, are to be considered in all respects illustrative rather than limiting the invention described herein. Scope of the disclosure is thus indicated by the appended claims, rather than by the foregoing description, and all changes that come within the meaning and range of equivalency of the claims are intended to be embraced therein.

The invention claimed is:
1. A semiconductor device comprising:
a substrate, the substrate includes
a prime region having circuit components,
a seal ring region surrounding the prime region, and
a kerf region;
a back-end-of-line (BEOL) dielectric disposed on the substrate covering the prime region with the circuit components, the seal ring region and the kerf region, the BEOL dielectric includes
a plurality of interlevel dielectric (ILD) levels, an ILD level of the ILD levels includes
a via dielectric level with via contacts,
a metal dielectric level with metal lines,
the metal lines and the via contacts of the ILD levels interconnect the circuit components of the prime region, and
wherein
a bottom ILD level is a first ILD level of the BEOL dielectric,
one or more intermediate ILD levels is disposed above the bottom ILD level, and
a top ILD level is disposed above the intermediate ILD levels, wherein a top metal level of the top ILD level serves as a pad level with pads; and
a seal ring disposed in the BEOL dielectric over the seal ring region of the substrate, the seal ring comprises an inner moisture oxygen barrier (MOB) ring adjacent to the prime region and an outer crack stop (CS) ring adjacent to the kerf region, wherein
the MOB ring includes
MOB metal level metal line structures disposed in metal dielectric levels of the ILD levels except the top metal dielectric level,
MOB via level metal line structures disposed in via dielectric levels of the ILD levels, and
the MOB metal level metal line structures and the MOB via level metal line structures include MOB chamfered corners which are devoid of acute angles, and
the CS ring includes
CS metal level metal line structures disposed in metal dielectric levels of the ILD levels,
CS via level metal line structures disposed in via dielectric levels of the ILD levels, and
the CS metal level metal line structures and the CS via level metal line structures include CS chamfered corners which are devoid of acute angles.

2. The device of claim 1 wherein the MOB ring includes the via level metal line structures in via dielectric levels of the ILD levels except the top via dielectric level of the top ILD level.

3. The device of claim 1 wherein the CS chamfered corners each comprises inner and outer chamfers forming a polygonal shape which is devoid of acute angles.

4. The device of claim 3 wherein the polygonal shape of the chamfer corners comprises a hexagonal shape.

5. The device of claim 3 wherein a space within the polygonal shaped chamfered corners comprises a marker pattern.

6. The device of claim 3 wherein a line width of the CS metal level metal line structures is wider than a via width of the CS via level metal line structures.

7. The device of claim 3 wherein the MOB metal line structures and the MOB via level metal line structures follow a pattern of the CS metal line structures and the CS via level metal line structures.

8. The device of claim 7 wherein the chamfered corners of the MOB metal line structures and the MOB via line structures are similar to the inner chamfer of the CS chamfered corners.

9. A method of forming a semiconductor device comprising:

providing a substrate, the substrate is prepared with
  a prime region having circuit components,
  a seal ring region surrounding the prime region, and
  a kerf region;
forming a back-end-of-line (BEOL) dielectric disposed the substrate covering the sprime region with the circuit components, the seal ring region and the kerf region, the BEOL dielectric includes
  a plurality of interlevel dielectric (ILD) levels, an ILD level of the ILD levels includes
    a via dielectric level with via contacts,
    a metal dielectric level with metal lines,
    the metal lines and the via contacts of the ILD levels interconnect the circuit components of the prime region, and
    wherein
      a bottom ILD level is a first ILD level of the BEOL dielectric,
      one or more intermediate ILD levels is disposed above the bottom ILD level, and
      a top ILD level is disposed above the intermediate ILD levels, wherein a top metal level of the top ILD level serves as a pad level with pads; and
forming a seal ring in the BEOL dielectric over the seal ring region of the substrate along with forming metal lines and via contacts, the seal ring comprises an inner moisture oxygen barrier (MOB) ring adjacent to the prime region and an outer crack stop (CS) ring adjacent to the kerf region, wherein
  the MOB ring includes
    MOB metal level metal line structures disposed in metal dielectric levels of the ILD levels except the top metal dielectric level,
    MOB via level metal line structures disposed in via dielectric levels of the ILD levels, and
    the MOB metal level metal line structures and the MOB via level metal line structures include MOB chamfered corners which are devoid of acute angles, and
  the CS ring includes
    CS metal level metal line structures disposed in metal dielectric levels of the ILD levels,
    CS via level metal line structures disposed in via dielectric levels of the ILD levels, and
    the CS metal level metal line structures and the CS via level metal line structures include CS chamfered corners which are devoid of acute angles.

10. The method of claim 9 wherein the MOB ring includes the via level metal line structures in via dielectric levels of the ILD levels except the top via dielectric level of the top ILD level.

11. The method of claim 9 wherein the CS chamfered corners each comprises inner and outer chamfers forming a polygonal shape which is devoid of acute angles.

12. The method of claim 11 wherein the polygonal shape of the chamfer corners comprises a hexagonal shape.

13. The method of claim 11 wherein a space within the polygonal shaped chamfered corners comprises a marker pattern.

14. The method of claim 11 wherein a line width of the CS metal level metal line structures is wider than a via width of the CS via level metal line structures.

15. The method of claim 11 wherein the MOB metal line structures and the MOB via level metal line structures follow a pattern of the CS metal line structures and the CS via level metal line structures.

16. The method of claim 15 wherein the chamfered corners of the MOB metal line structures and the MOB via line structures are similar to the inner chamfer of the CS chamfered corners.

17. A semiconductor device comprising:
  a substrate, the substrate includes
    a prime region having circuit components,
    a seal ring region surrounding the prime region, and
    a kerf region;
  a back-end-of-line (BEOL) dielectric disposed on the substrate covering the prime region with the circuit components, the seal ring region and the kerf region, the BEOL dielectric includes
    a plurality of interlevel dielectric (ILD) levels, an ILD level of the ILD levels includes
      a via dielectric level with via contacts,
      a metal dielectric level with metal lines,
      the metal lines and the via contacts of the ILD levels interconnect the circuit components of the prime region, and
      wherein
        a bottom ILD level is a first ILD level of the BEOL dielectric,
        one or more intermediate ILD levels is disposed above the bottom ILD level, and
        a top ILD level is disposed above the intermediate ILD levels, wherein a top metal level of the top ILD level serves as a pad level with pads; and
  a seal ring disposed in the BEOL dielectric over the seal ring region of the substrate, the seal ring comprises an inner moisture oxygen barrier (MOB) ring adjacent to the prime region and an outer crack stop (CS) ring adjacent to the kerf region, wherein
    the MOB ring includes
      MOB metal level metal line structures disposed in metal dielectric levels of the ILD levels,
      MOB via level metal line structures disposed in via dielectric levels of the ILD levels, and
      the MOB metal level metal line structures and the MOB via level metal line structures include MOB chamfered corners which are devoid of acute angles, and
    the CS ring includes
      CS metal level metal line structures disposed in metal dielectric levels of the ILD levels,
      CS via level metal line structures disposed in via dielectric levels of the ILD levels, and
      the CS metal level metal line structures and the CS via level metal line structures include CS chamfered corners which are devoid of acute angles.

18. The device of claim 17 wherein the CS chamfered corners each comprise inner and outer chamfers forming a polygonal shape which is devoid of acute angles.

19. The device of claim 18 wherein the polygonal shape of the chamfer corners comprises a hexagonal shape.

20. The device of claim 18 wherein a space within the polygonal shaped chamfered corners comprises a marker pattern.

* * * * *